United States Patent [19]
Watanabe

[11] Patent Number: 6,034,874
[45] Date of Patent: Mar. 7, 2000

[54] ELECTRONIC DEVICE WITH HEAT RADIATING MEMBER

[75] Inventor: Yoshikiyo Watanabe, Fukushima-ken, Japan

[73] Assignee: Alps Electric Co., Ltd., Japan

[21] Appl. No.: 09/313,459

[22] Filed: May 17, 1999

[30] Foreign Application Priority Data

May 27, 1998 [JP] Japan .................................. 10-145754

[51] Int. Cl.[7] .................................................. H05K 7/20
[52] U.S. Cl. .......................... 361/704; 361/707; 361/709; 361/710; 361/719; 361/720; 165/80.3; 174/16.3; 257/718
[58] Field of Search .................................. 361/688–690, 361/697, 702–704, 707, 709–711, 719, 720; 257/706, 707, 718–722, 727; 174/16.1, 16.3; 165/80.2, 80.3

[56] References Cited

U.S. PATENT DOCUMENTS

| 4,235,285 | 11/1980 | Johnson et al. | 165/80.3 |
|---|---|---|---|
| 5,280,409 | 1/1994 | Selna et al. | 361/720 |
| 5,282,111 | 1/1994 | Hopfer | 361/704 |
| 5,307,236 | 4/1994 | Rio et al. | 361/720 |
| 5,546,275 | 8/1996 | Moutrie et al. | 361/707 |
| 5,930,114 | 7/1999 | Kuzmin et al. | 361/707 |
| 5,949,648 | 9/1999 | Liao | 361/700 |

FOREIGN PATENT DOCUMENTS

| 59-98652 | 7/1984 | Japan . |
|---|---|---|
| 61-142456 | 9/1986 | Japan . |
| 61-166541 | 10/1986 | Japan . |
| 62-134252 | 8/1987 | Japan . |

*Primary Examiner*—Leo P. Picard
*Assistant Examiner*—Boris Chervinsky
*Attorney, Agent, or Firm*—Brinks Hofer Gilson & Lione

[57] ABSTRACT

The electronic device of the present invention includes a printed wiring board having wiring patterns, a heat generating component connected to the wiring patterns, a heat radiating member formed of a metal, the heat radiating member having a base portion, a tongue piece formed by cutting the base portion and raising the cut portion, and a pair of mounting legs, and a frame for mounting the printed wiring board, the mounting legs of the heat radiating member being positioned at both opposed sides of the printed wiring board so that the base portion of the heat radiating member is located above the printed wiring board and so that the heat radiating member straddles the printed wiring board, and the tongue piece of the heat radiating member being in elastic contact with the heat generating component.

8 Claims, 2 Drawing Sheets

ELECTRONIC DEVICE WITH HEAT RADIATING MEMBER

BACKGROUND OF THE INVENTION

1. Field of the Invention

The present invention relates to an electronic device such as a transmitter-receiver unit in a portable telephone provided with heat generating components.

2. Description of the Related Art

A conventional electronic device will now be described with reference to FIG. 2, which is an exploded perspective view showing principal portions of a conventional electronic device.

As shown in FIG. 2, a frame 11 is formed in a rectangular box shape by molding using an insulating synthetic resin material. The frame 11 comprises side walls 11b which define the rectangular shape and a bottom wall 11a of a rectangular shape which partitions the inside space formed by the side walls 11b into upper and lower space portions. The upper space portion serves as a receptacle portion 11g which is open upward and the lower space portion serves as a vacant space portion 11h which is open downward.

Retaining portions 11f extending downward are formed respectively at lower end portions of opposed side walls 11b. Further, a metallic film (not shown) is formed on the whole surface of the frame 11 by plating for example.

A printed wiring board 12 is a flat board of a generally rectangular shape, with wiring patterns 12a of a desired shape being formed on one or both sides of the board 12. The printed wiring board 12 is mounted to the receptacle portion 11g of the frame 11 by a suitable means and is held therein.

Heat generating components 13, which are power transistors for example, each have a body portion 13a of a rectangular shape and a plurality of terminals (not shown) projecting outward from side walls of the body portion 13a.

The body portion 13a of each heat generating component 13 is put on the printed wiring board 12 and the terminals (not shown) are soldered to the wiring patterns 12a on the board 12, whereby the heat generating component 13 is installed on the printed wiring board.

A plurality of heat radiating members 14 are each formed by cutting and bending a metallic plate. The heat radiating members 14 each comprise a base portion 14a which is in the form of a rectangular flat plate, a U-shaped arm portion 14b extending upward from the base portion 14a, and a mounting portion 14c extending from the arm portion 14b, with a hole 14d being formed in the mounting portion 14c.

The plural heat radiating members 14 are mounted onto the printed wiring board 12 each individually by inserting a screw (not shown) through the hole 14d of the mounting portion 14c threadedly into the printed wiring board 12. This mounting operation is performed in such a manner that the lower surface of the base portion 14a comes into abutment against the upper surface of the body portion 13a of the associated heat generating component 13. The heat generated from the heat generating component 13 is radiated through the heat radiating member 14.

A mother board 16 is formed in the shape of a flat plate using an insulating resin material. Electronic components are mounted thereon such as a memory unit for storing telephone numbers and an arithmetic unit for carrying out various arithmetic operations. The frame 11 is put on the mother board 16 and secured to the same board by its retaining portions 11f.

In the conventional electronic device, however, since the heat radiating members for radiating the heat generated from heat generating components are mounted with screws or the like to the printed wiring board, the board is required to have a plurality of mounting portions such as tapped holes for mounting the plural heat radiating members, with consequent increase in size of the board, that is, increase in size of the electronic device. Besides, the screw tightening operation is required at every mounting of each heat radiating member, thus giving rise to the problem that the number of working steps increases.

Another problem is that if the heat radiating members are provided so as to have a sufficient heat radiating area, an increase in size of the same members results, with consequent increase in size of the electronic device.

SUMMARY OF THE INVENTION

The present invention has been accomplished for solving the above-mentioned problems and it is an object of the invention to provide a small-sized electronic device easy to assemble and having heat radiating members with a sufficient heat radiating area against heat generated from heat generating components.

According to the present invention, in order to achieve the above-mentioned object, there is provided, in the first aspect thereof, an electronic device including a printed wiring board having wiring patterns; a heat generating component connected to the wiring patterns; a heat radiating member formed of a metal and having a base portion, a tongue piece formed by cutting the base portion and raising the cut portion, and a pair of mounting legs; and a frame for mounting the printed wiring board, and wherein the mounting legs of the heat radiating member are positioned at both opposed sides of the printed wiring board so that the heat radiating member straddles the printed wiring board, with its base portion being located above the printed wiring board, and so that the tongue piece of the heat radiating member is in elastic contact with the heat generating component.

According to the second aspect of the present invention there is provided, in combination with the above first aspect, an electronic device wherein the mounting legs of the heat radiating member have retaining portions respectively to lock the heat radiating member to the printed wiring board or to the frame.

According to the third aspect of the present invention there is provided, in combination with the above first aspect, an electronic device wherein end portions of the paired mounting legs are projected downward from the lower ends of side walls of the frame.

According to the present invention, in the fourth aspect thereof, there is provided an electronic device including a printed wiring board having wiring patterns; a heat generating component connected to the wiring patterns; a heat radiating member formed of a metal and having a conductive portion and mounting portions formed at both ends of the conductive portion; and a frame for mounting the printed wiring board, the frame having a vacant space portion formed on the lower surface side of the printed wiring board as mounted to the frame, and wherein the conductive portion of the heat radiating member is disposed within the vacant space portion of the frame and in this state one of the mounting portions of the heat radiating member is soldered to the wiring patterns located near the heat generating component.

According to the fifth aspect of the present invention there is provided, in combination with the above fourth aspect, an electronic device wherein an extending wiring pattern portion which constitutes a part of the wiring patterns is formed on the printed wiring board at a position opposed to the lower surface of the heat generating component, and the heat generating component is brought into abutment with the extending wiring pattern portion.

According to the sixth aspect of the present invention there is provided, in combination with the above fifth aspect, an electronic device wherein the extending wiring pattern portion is an earth pattern.

According to the seventh aspect of the present invention there is provided, in combination with the above fourth aspect, an electronic device further including a heat radiating member formed of a metal and having a base portion, a tongue piece formed by cutting the base portion and raising the cut portion, and a pair of mounting legs, the mounting legs of the heat radiating member being positioned at both opposed sides of the printed wiring board so that the heat radiating member straddles the printed wiring board, with its base portion being located above the printed wiring board, and so that the tongue piece of the heat radiating member is in elastic contact with the upper surface of the heat generating component.

According to the eighth aspect of the present invention there is provided, in combination with the above seventh aspect, an electronic device further including a mother board for mounting the frame thereto, and wherein end portions of the paired mounting legs of the heat radiating member are projected downward from the lower ends of side walls of the frame and the mounting legs are secured to the mother board, and the other mounting portion of the heat radiating member is also secured to the mother board.

DETAILED DESCRIPTION OF A PREFERRED EMBODIMENT

An electronic device embodying the present invention will be described hereinafter with reference to FIG. 1, which is an exploded perspective view of the electronic device.

Figure 1:
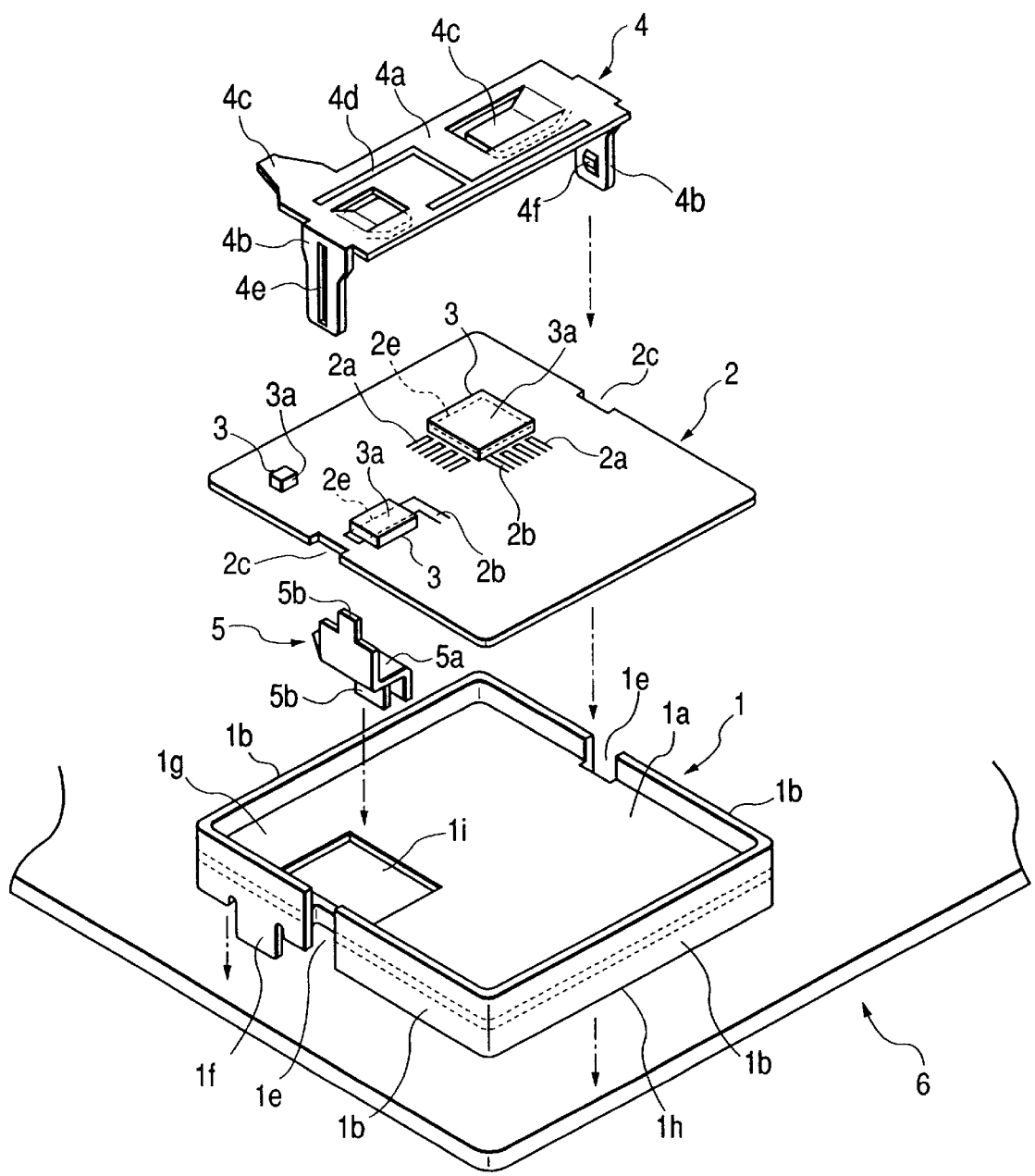
FIG. 1 is an exploded perspective view of an electronic device embodying the present invention.
Figure 2:
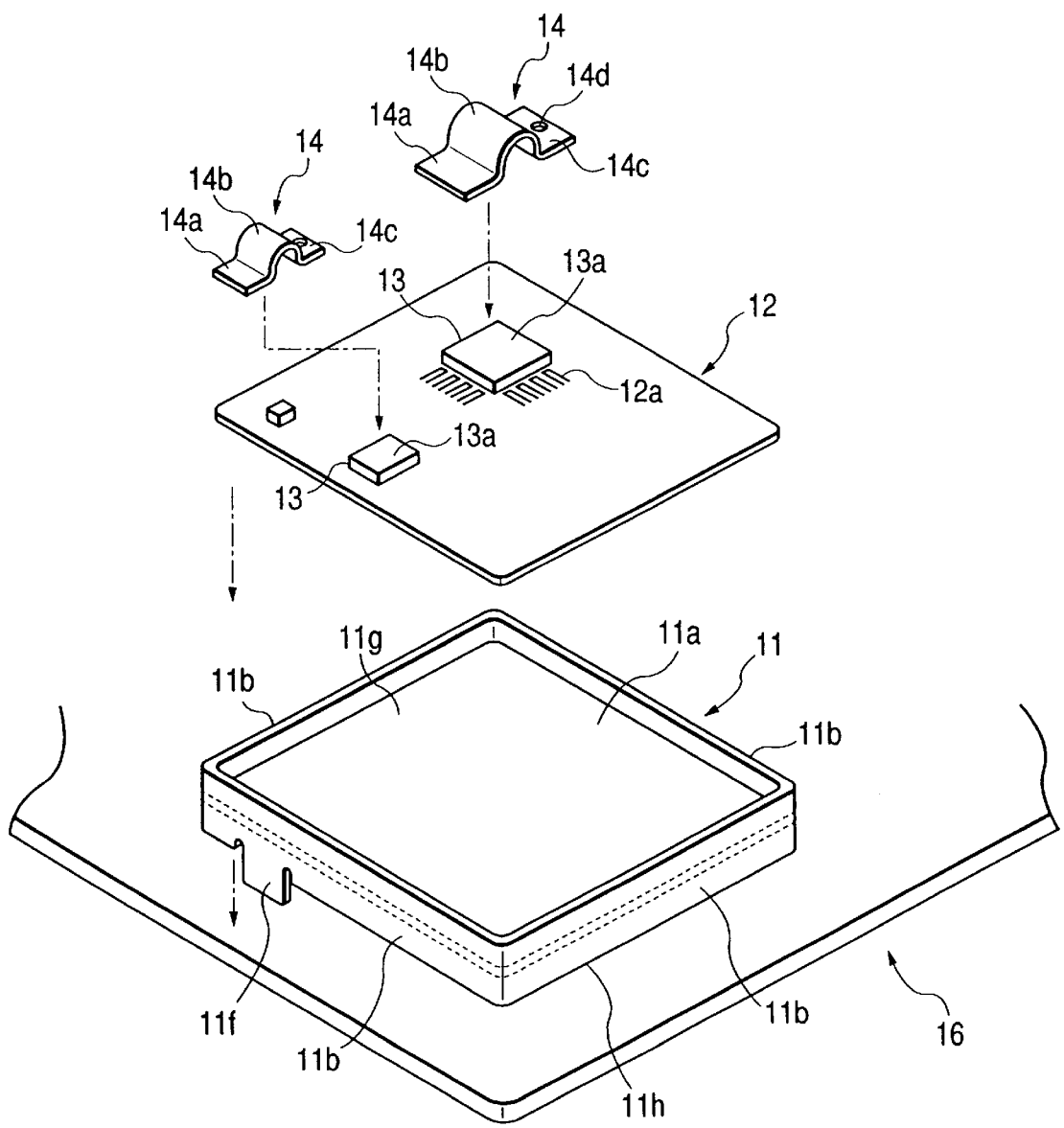
FIG. 2 is an exploded perspective view of a conventional electronic device.

As shown in FIG. 1, a frame 1 is formed in a generally box shape by molding using an insulating synthetic resin material. The frame 1 comprises side walls 1b which define a rectangular shape and a rectangular bottom wall 1a which partitions the inside space formed by the side walls 1b into upper and lower space portions. The upper space portion serves as a receptacle portion 1g which is open upward and the lower space portion serves as a vacant space portion 1h which is open downward.

In opposed side walls 1b are formed slit-like gap portions 1e, and a pair of downwardly extending retaining portions 1f are formed respectively at the lower end portions of the opposed side walls 1b.

A rectangular hole 1i is formed in the bottom wall 1a. Further, a metallic film (not shown) is formed on the whole surface of the frame 1 by plating for example.

The reason why the frame 1 is formed by molding using an insulating synthetic resin material is because a lightweight frame 1 can be constituted in comparison with a metallic frame.

The printed wiring board 2, which is in the form of a generally rectangular flat plate, is provided on one or both sides thereof with a first wiring pattern 2a of a desired shape, a second wiring pattern 2b which is an earth pattern, and electronic components (not shown) connected to the first and second wiring patterns 2a, 2b such as coils, integrated circuit (LSI) and chip resistor. The second wiring pattern 2b is provided with an extending portion 2e which constitutes a part of the second wiring pattern 2b.

A pair of rectangular cutout portions 2c are formed in opposed longitudinal ends of the printed wiring board 2.

The printed wiring board 2 is mounted to the receptacle portion 1g of the frame 1 by a suitable means and is held therein.

In this state, the cutout portions 2c of the printed wiring board 2 and the gap portions 1e of the frame 1 are opposed to each other.

A plurality of heat generating components 3, which are such as power transistors, each have a box-shaped body portion 3a and a plurality of terminals (not shown) projecting outward from a side wall of the body portion 3a.

The body portions 3a of the heat generating components 3 are put on the printed wiring board 2 and in this state the terminals (not shown) are soldered to the first and second wiring patterns 2a, 2b on the board 2, whereby the heat generating components 3 are mounted onto the printed wiring board.

In this state, the extending portion 2e of the second wiring pattern 2b as an earth pattern is positioned on the printed wiring board portion opposed to the lower surface of each heat generating component 3, and the lower surface of the heat generating component 3 is in abutment with the extending portion 2e.

A heat radiating member 4 is formed in a general U shape in section by cutting and bending a metallic plate. The heat radiating member 4 has a base portion 4a which is generally in the form of a flat plate and a pair of downwardly bent mounting legs 4b formed at both ends of the base portion 4a perpendicularly to the base portion 4a.

The base portion 4a has a plurality of tongue portions 4c extending obliquely downward, the tongue portions 4c being formed by cutting the base portion 4a and raising the cut portions, and a plurality of ridge portions 4d projecting upward in the vicinity of the tongue portions 4c.

The mounting legs 4b are each provided with a ridge portion 4e projecting outward and a retaining portion 4f projecting inward.

The ridge portions 4d and 4e are for enhancing the strength of both base portion 4a and mounting legs 4b against a bending force.

In the heat radiating member 4 constructed as above, the tongue pieces 4c of the base portion 4a are in elastic contact with the upper surfaces of the body portions 3a of the plural heat generating components 3, and the paired mounting legs 4b are engaged and held in the gap portions 1e of the frame 1 and also in the cutout portions 2c of the printed wiring board 2. At this time, the retaining portions 4f of the mounting legs 4b are locked to the cutout portions 2c of the printed wiring board 2. Thus, the mounting legs 4b of the heat radiating member 4 are positioned on both opposed sides of the printed wiring board 2 so that the base portion 4a of the heat radiating member 4 is located above the board 2 and so that the heat radiating member 4 straddles both frame 1 and printed wiring board 2.

The lower ends of the paired mounting legs 4b of the heat radiating member 4 are projected downward from the lower ends of the associated side walls 1b of the frame 1.

The heat radiating member 5 is formed by cutting and bending a metallic plate and it comprises a conductive portion 5a having stepped portions and a pair of mounting portions 5b formed respectively at upper and lower ends of the conductive portion 5a.

One of the mounting portions 5b is located near a heat generating component 3 mounted on the printed wiring board 2 and is soldered to the second wiring pattern 2b which is connected to the earth pattern opposed to the lower surface of the heat generating component 3. This mounting portion 5b is fixed so as to perpendicularly intersect the lower surface of the printed wiring board 2. In this state, the conductive portion 5a extends through the hole 1i formed in the bottom wall 1a of the frame 1 into the vacant space portion 1h of the frame 1.

A mother board 6 is formed in the shape of a flat plate using an insulating resin material, with electronic components (not shown) being mounted thereon such as a memory unit for storing telephone numbers and an arithmetic unit for carrying out various operations. A plurality of rectangular holes are formed in the mother board though not shown. The retaining portions 1f of the frame 1 are inserted into holes (not shown) formed in the mother board 6, whereby the frame 1 is mounted on the mother board 6.

In this state, the paired mounting legs 4b of the heat radiating member 4 are inserted through holes formed in the mother board 6 and are fixed by soldering to a printed wiring (not shown) formed on the mother board 6. The other mounting portion 5b of the heat radiating member 5 is inserted trough a hole formed in the mother board 6 and is fixed to the printed wiring (not shown) on the mother board 6 by soldering.

Using a suitable means, the mother board 6 is received in a case formed of a synthetic resin material.

Although in the above embodiment the retaining portions 4f formed on the paired mounting legs of the heat radiating member 4 are locked to the printed wiring board 2, this constitutes no limitation. The retaining portions 4f may be locked to the frame 1.

The following description is now provided about how to assemble the electronic device of the present invention.

First, the heat generating components 3 and electronic components (not shown) are soldered to the wiring patterns 2a and 2b formed on the printed wiring board 2.

Next, one mounting portion 5b of the heat radiating member 5 is soldered to the second wiring pattern 2b located near a heat generating component 3 on the board 2.

Then, the printed wiring board 2 is mounted to the receptacle portion 1g of the frame 1 with use of a suitable means. At this time, the heat radiating member 5 extends through the hole 1i of the frame 1 so that its conductive portion 5a is located within the vacant space portion 1h.

Next, the heat radiating member 4 is brought into engagement with both printed wiring board 2 and frame 1 so as to straddle the board 2 and the frame 1. At this time, the tongue portions 4c of the heat radiating member 4 are brought into elastic contact with the upper surfaces of the heat generating components 3, and the paired mounting legs 4b are brought into engagement with the cutout portions 2c of the printed wiring board 2 and also with the gap portions 1e of the frame 1. Further, the retaining portions 4f of the mounting legs 4b are locked to the cutout portions 2c.

Then, the frame 1 is put on the mother board 6. At this time, the retaining portion 1f of the frame 1 and the mounting legs 4b of the heat radiating member 4 are inserted through holes formed in the mother board and are soldered.

As set forth hereinabove, the electronic device of the present invention includes a printed wiring board having wiring patterns; a heat generating component connected to the wiring patterns; a heat radiating member having a base portion, a tongue piece formed by cutting the base portion and raising the cut portion, and mounting legs; and a frame for mounting the printed wiring board, the heat radiating member being disposed so as to straddle the printed wiring board and the frame, and the tongue portion of the heat radiating member being in elastic contact with the heat generating component. According to this construction there can be attained an effect such that the heat radiating member can be mounted to the printed wiring board easily by a single operation of placing it so as to straddle the printed wiring board without using any such mounting member as screws.

In the electronic device of the present invention, the base portion of the heat radiating member is provided with a pair of mounting legs extending downward from both ends of the base portion. The mounting legs hold the frame therebetween and it can be formed easily by cutting and bending. Besides, the mounting legs have retaining portions respectively, which are locked to the printed wiring board. Thus, the heat radiating member can be attached positively to the frame and the printed wiring board.

In the electronic device of the present invention, since end portions of the paired mounting legs of the heat radiating member are projected downward from the lower ends of side walls of the frame, the projected end portions of the mounting legs can be fixed easily to a mother board.

Further, the electronic device of the present invention includes a printed wiring board having wiring patterns; a heat generating component connected to the wiring patterns; a heat radiating member formed of a metal and having a conductive portion and mounting portions formed at both ends of the conductive portion; and a frame for mounting the printed wiring board, the frame having a vacant space portion formed on the lower surface side of the printed wiring board as mounted to the frame, the conductive portion of the heat radiating member being disposed within the vacant space portion of the frame and in this state one of the mounting portions of the heat radiating member being soldered to the wiring patterns located near the heat generating component. According to this construction, not only the electronic device can be reduced in size, but also the heat generated from the heat generating component is conducted up to the mother board through the heat radiating member, and thus there is obtained an effect that the generated head is sure to be radiated by both the heat radiating member and the mother board.

In the electronic device of the present invention, an extending wiring pattern portion is formed on the printed wiring board at a position opposed to the lower surface of the heat generating component, and the heat generating component is brought into abutment with the extending wiring pattern portion. Further, the wiring patterns and the heat radiating member are soldered with each other. Therefore, the heat generated from the heat generating component is conducted to the heat radiating member through the wiring patterns and thus can surely be radiated.

The electronic device of the present invention includes a printed wiring board having wiring patterns; a heat generating component connected to the wiring patterns; a heat radiating member formed of a metal and having a base portion and a tongue piece substantially inclined downward from the base portion; another heat radiating member formed of a metal and having a conductive portion and mounting portions formed at both ends of the conductive portion; a frame for mounting the printed wiring board; and a mother board to which the frame is to be mounted, the former heat radiating member being disposed so as to straddle the printed wiring board and the frame, the tongue portion of the former heat radiating member being in elastic contact with the heat generating component, one of the mounting portions of the latter heat radiating member being disposed near the wiring pattern connected to the heat generating component, and the other mounting portion of the latter heat radiating member being mounted to the mother board. Therefore, the heat generated from the heat generating component can be surely radiated through both heat radiating members, thus permitting reduction in size of the electronic device.

What is claimed is:

1. An electronic device comprising:

a printed wiring board having wiring patterns;

a heat generating component connected to said wiring patterns;

a heat radiating member formed of a metal, said heat radiating member having a base portion, a tongue piece formed by cutting said base portion and raising the cut portion, and a pair of mounting legs; and a frame for mounting said printed wiring board, and wherein said mounting legs of said heat radiating member are positioned at both opposed sides of said printed wiring board so that the heat radiating member straddles the printed wiring board, with said base portion of the heat radiating member being located above the printed wiring board, and so that said tongue piece of the heat radiating member is in elastic contact with said heat generating component.

2. An electronic device according to claim 1, wherein said mounting legs of said heat radiating me er have retaining portions respectively to lock the heat radiating member to said printed wiring board or to said frame.

3. An electronic device according to claim wherein end portions of the pair of mounting legs of said heat radiating member are projected downward from lower ends of side walls of said frame.

4. An electronic device comprising:

a printed wiring board having wiring patterns;

a heat generating component connected to said wiring patterns;

a first heat radiating member formed of a metal, said first heat radiating member having a conductive portion and mounting portions formed at both ends of said conductive portion; and a frame for mounting said printed wiring board, said frame having a vacant space portion formed on the lower surface side of said printed wiring board as mounted to the frame, and wherein said conductive portion of said first heat radiating member is disposed within said vacant space portion of said frame and in this state one of the mounting portions of said first heat radiating member is soldered to the wiring patterns located near said heat generating component.

5. An electronic device according to claim 4, wherein an extending wiring pattern portion which constitutes a part of the wiring patterns is formed on said printed wiring board at a position opposed to the lower surface of said heat generating component, and the heat generating component is brought into abutment with said extending wiring pattern portion.

6. An electronic device according to claim 5, wherein said extending wiring pattern portion is an earth pattern.

7. An electronic device according to claim 4, further including a second heat radiating member formed of a metal, said second heat radiating member having a base portion, a tongue piece formed by cutting said base portion and raising the cut portion, and a pair of mounting legs, said mounting legs of said second heat radiating member being positioned at both opposed sides of said printed wiring board so that the second heat radiating member straddles the printed wiring board, with said base portion of the second heat radiating member being located above the printed wiring board, and so that said tongue piece of the second heat radiating member is in elastic contact with the upper surface of said heat generating component.

8. An electronic device according to claim 7, further including a mother board for mounting said frame thereto, and wherein end portions of the pair of mounting legs of said second heat radiating member are projected downward from the lower ends of side walls of said frame, said mounting legs are secured to said mother board, and the other mounting portion of said first heat radiating member is also secured to the mother board.

* * * * *